TRANSISTOR CHOPPER

Filed Aug. 21, 1961 2 Sheets-Sheet 1

INVENTORS.
JOHN J. MORRISON
GEORGE N. KATSELIS
BY Arthur H. Swanson
ATTORNEY.

INVENTORS.
JOHN J. MORRISON
GEORGE N. KATSELIS
BY Arthur H. Swanson
ATTORNEY.

United States Patent Office 3,229,190
Patented Jan. 11, 1966

3,229,190
TRANSISTOR CHOPPER

John Jack Morrison, Bothwell, and George N. Katselis, Glasgow, Scotland, assignors to Honeywell Inc., a corporation of Delaware
Filed Aug. 21, 1961, Ser. No. 132,652
8 Claims. (Cl. 321—45)

Figure 1:
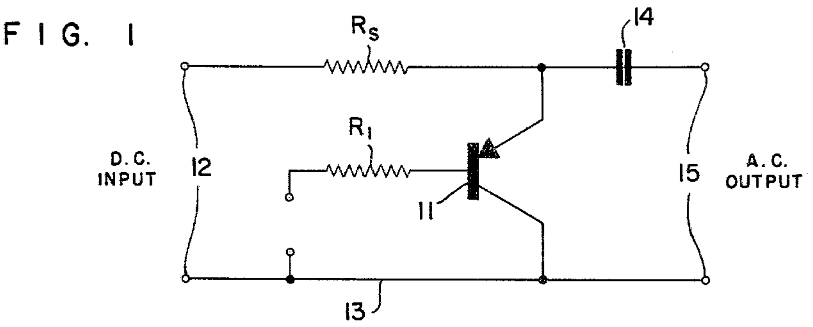

This invention relates to transistor modulators, especially when used as the modulator or chopper in a chopper amplifier.

The sensitivity of a D.C. amplifier or measuring system is determined by the amount of noise which is present, since input signals of smaller amplitude than the noise cannot be distinguished. This noise may be present as a random variation about the operating point of the amplifier, or as a gradual drift of the operating point which may be caused for example by variations in high voltage supply on directly coupled amplifiers or in the case of transistor circuits variations in leakage currents due to temperature changes. One of the most successful techniques for reducing the drift in D.C. amplifiers is by employment of the modulated or chopper amplifier. In this type of amplifier the D.C. signal is converted into an A.C. signal in a suitable modulator, and the A.C. signal is then amplified by an A.C. amplifier of conventional design.

To constitute the modulator or chopper a transistor circuit can be employed in which the transistor operates as a switch. A simple conventional transistor chopping switch comprises a transistor having a D.C. input applied to its emitter-collector circuit via a source impedance, and a chopping waveform applied to its base via a base resistor, the A.C. output being taken from the emitter-collector circuit via an output capacitor.

However, such a transistor switch suffers from two principal disadvantages. Firstly, there is an error due to the residual voltage across the switch when closed owing to its finite resistance. Secondly, when the switch is open, leakage current flows in the source impedance producing a further error.

The effect of leakage current can be reduced by preventing the base becoming positive during the open part of the switch cycle but while this technique improves the no-signal performance of the switch the open impedance of the switch falls and the efficiency of the switch is impaired.

It is an object of this invention to improve the zero signal output waveform of the transistor switch, and to reduce the temperature drift to a very low level.

According to the present invention, there is provided a modulator circuit comprising a transistor having a D.C. input applied, and an A.C. output taken, across the emitter and collector thereof, and a driving A.C. waveform applied to its base, and wherein a source of the driving waveform is connected between the base and a junction between two resistive impedances connected respectively to the emitter and collector, the resistance values being adjusted so that at zero D.C. input the ratio of the forward diode resistance of the emitter-base diode to the resistance of the emitter-connected impedance is substantially equal to the ratio of the collector-base forward diode resistance and the resistance of the collector-connected impedance.

A particular feature of the preferred form of the circuit is the use of a symmetrical transistor such that the ratio of the emitter and collector diode resistances is substantially constant with temperature variation.

According to another aspect of the invention, an electrical modulator circuit comprises a transistor, D.C. input terminals connected to the emitter and collector electrodes of the transistor, A.C. output terminals likewise connected to the emitter and collector electrodes, a potentiometer winding connected between the emitter and collector electrodes, and a source of a driving A.C. waveform connected between the slider of the potentiometer and the transistor base.

Figure 2:
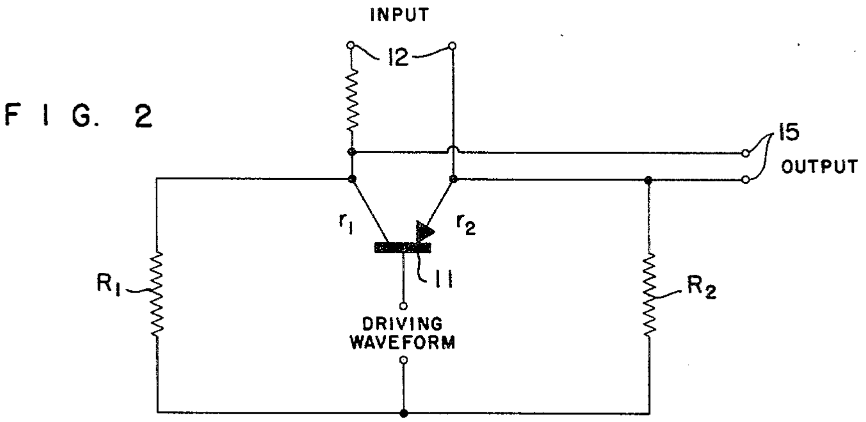
Figure 3:
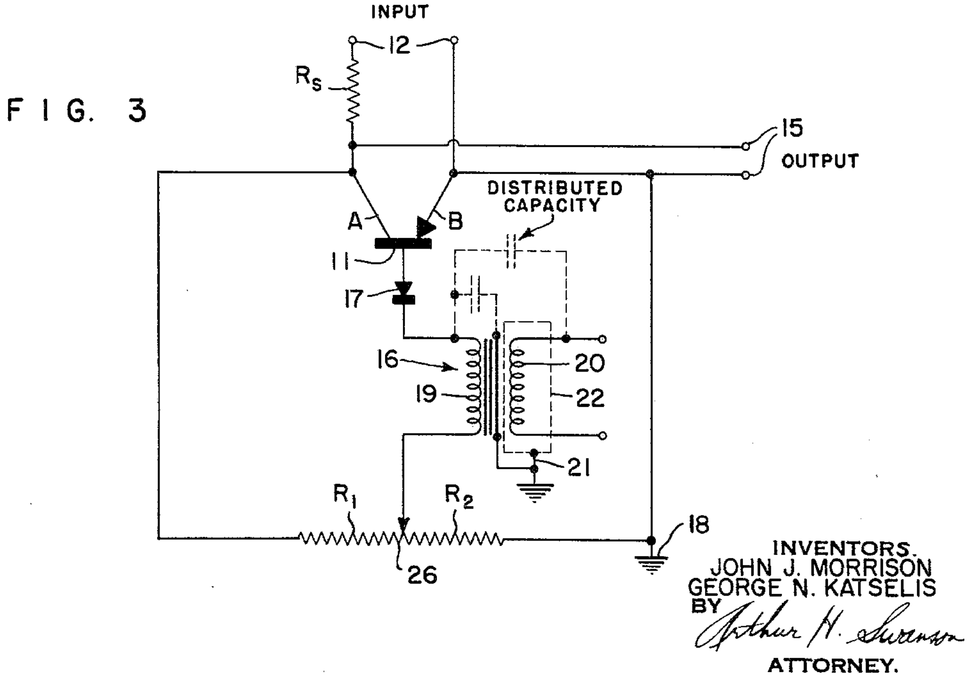
Figure 4:
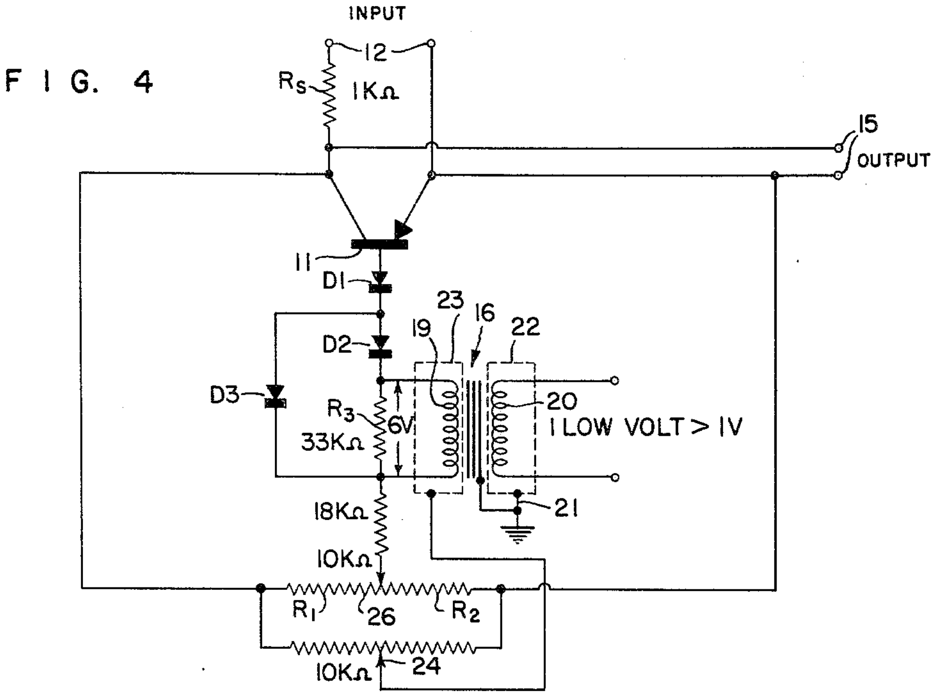
Figure 5:
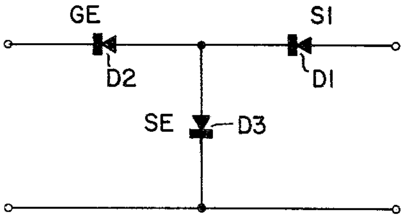
Figure 6:
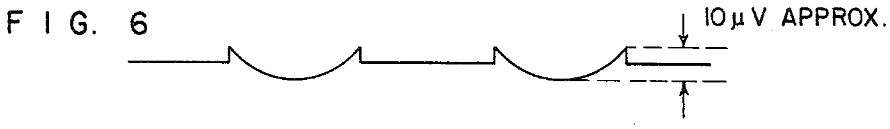
Figure 7:
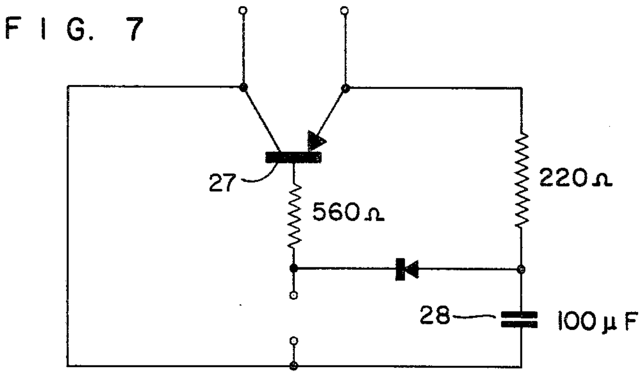

A better understanding of the nature of the invention will be had from the following description of specific circuits given with reference to the diagrammatic drawings accompanying the specification. In the drawings:

FIGURE 1 is an electrical circuit diagram of a conventional transistor chopping switch, FIGURES 2, 3 and 4 are diagrams of transistor chopping switch circuits in accordance with the present invention, FIGURE 5 is a diagram of a diode network employed in the circuit of FIGURE 4, FIGURE 6 shows the waveform output of a circuit such as that of FIGURE 4 at zero input signal when the driving waveform is sinusoidal, and FIGURE 7 is a diagram of a circuit for producing a square driving waveform.

Referring firstly to FIGURE 1, this shows the usual form of transistor chopping switch in which the transistor 11 has the D.C. input applied between terminals 12 one of which is connected through an input resistor $R_S$ to the emitter of the transistor while the other is at reference potential and is connected to the transistor collector by a line 13. The source of the chopping waveform is connected between the reference line 13 and a transistor base resistor $R_B$, and the A.C. output is taken between terminals 15 one of which is on the reference line 13 while the other is coupled to the transistor emitter by a capacitor 14.

The application of this kind of transistor switch is restricted to sensitivities of the order of 1 mv. because of the residual voltage $V_{ce}$ across the switch when closed, and because of the leakage current $I_{co}$ which flows in the source impedance $R_S$ when the switch is open. Thus, for zero D.C. input to the chopper the output voltage fluctuates between $V_{ce}$ when the transistor is bottomed and $I_{co}R_S$ at cut-off.

$V_{ce}$ is roughly inversely proportional to $R_S$, and $I_{co}R_S$ is of course proportional to $R_S$, so that half the cycle demands a large value of $R_S$ and the other a small value of $R_S$. Also $I_{co}$ increases with temperature exponentially and $V_{ce}$ is largely unaffected by temperature so that for equipment which has to operate over a wide range of ambient temperature the design is largely dictated by the $I_{co}R_S$ term.

If the transistor base is prevented from becoming positive during the open part of the switch cycle the no-signal performance is improved but the open impedance of the switch falls to about 10K ohms thus impairing the efficiency of the switch.

The basic circuit according to the invention is shown in FIGURE 2. The source of the driving waveform is now connected on the one hand directly to the base of the transistor 11 and on the other hand to the junction point of two resistors $R_1$ and $R_2$, which resistors are connected respectively to the transistor collector and emitter.

Consider this circuit at zero D.C. input. The transistor acts then as two diodes; let $r_1$ and $r_2$ represent the forward diode resistance of the collector and emitter diodes respectively. The circuit can now be considered as a simple bridge and if the values are adjusted so that $$\frac{r_1}{R_1}=\frac{r_2}{R_2}$$

then the output voltage is zero.

If a D.C. voltage is now applied to the input the transistor acts as a switch and an A.C. voltage of modulation frequency will appear at the output. The amplitude will be that of the input voltage and the phase will be dependent on the input polarity.

The variation of diode resistance with temperature is non-linear and is due to three factors:

(a) The conductance due to minority carriers increases exponentially as the temperature increases.
(b) The conductance due to majority carriers increases linearly as the temperature decreases.
(c) The forward voltage drop increases with temperature.

In the circuit of FIGURE 2, if a transistor is obtained where the collector and emitter diode temperature characteristics described above are identical then $r_1/r_2$=a constant at all temperatures and no null drift will occur.

These conditions are met very closely in a symmetrical transistor for the following reasons. The diodes are formed by similar pellets made from the same batch of material and similar in impurity doping, they have a common base wafer, and they are in intimate thermal contact and are operating under identical thermal and electrical conditions. Thus $r_1/r_2$ can be independent of temperature in the same way as two resistors of the same material and operating conditions.

It is to be noted that it is not necessary to have a perfectly symmetrical transistor, i.e. it is not imperative that $r_1=r_2$, only that the ratio $r_1/r_2$ is constant.

So far only forward characteristics have been considered and in fact in the case of a perfectly symmetrical transistor the reverse current produces no drift of the null. However, in a practical case it is ordinarily necessary to connect a silicon diode in the base circuit to minimize the effects of reverse currents.

FIGURE 3 shows a practical circuit with a driver transformer 16 and with a silicon diode 17 to prevent positive half cycles from reaching the base. The resistors $R_1$, $R_2$ are now provided by the two portions of the winding of a potentiometer 26. If in this circuit the emitter B is earthed as shown at 18, the secondary winding 19 of the transformer will possess capacity to earth and this will introduce a spurious E.M.F. at the output in the shape of an exponential spike, especially at the beginning of the open half cycle. Also it is possible for the primary winding 20 to induce a transient voltage into the secondary via the interwinding capacity. The latter difficulty can be overcome by using a rectangular core section and winding primary and secondary on separate limbs; this gives an interwinding capacity of less than one $\mu\mu$f. The primary can have an electrostatic screen 22 which is connected to the transformer core and earth as at 21.

The problem of secondary to core capacity can be dealt with by connecting an RC filter from one side of the secondary to the transistor collector A, but this circuit is difficult to adjust and unless the thermal drift of the filter components is equal to that of the distributed capacity this method fails to provide good cancellation at all temperatures. The method adopted is to completely enclose the secondary winding in an electrostatic screen and to connect this screen to the base of the transistor. In critical cases a further improvement can be achieved, in the manner illustrated in FIGURE 4, by connecting this screen 23 to the wiper 24 of a potentiometer 25 across the electrodes A and B. Thus the stray capacity exists between the winding and the screen and can be returned to any intermediate point between A and B. A circuit including this screening of the secondary winding is shown in FIGURE 4.

The screen 23 can conveniently be formed by a wrapping of copper foil before and after the secondary winding of the transformer, the two layers being connected together to form the screen.

The diode divider network D1, D2, D3 of FIGURE 4, and detailed in FIGURE 5, passes only negative half-cycles. Germanium (Ge) and selenium (Se) diodes are provided to keep the reverse voltage applied to the silicon diode (Si) low and so minimize the reverse current. Silicon is used for its high reverse resistance and selenium because of its low forward volt drop. The diode divider network can be replaced by a single diode if a sufficiently high reverse resistance can be obtained.

The resistor $R_s$ is an input current limiter, and the resistor $R_3$ is provided to load the transformer during the non-conducting half-cycles and so prevent excessive "ringing."

The previous discussion has considered steady state temperature conditions only and unless great care is taken in the layout and construction of the unit, temporary drifts can be present during fast rates of change of temperature because the various components of the circuit may have different thermal capacity and insulation from each other. To avoid this difficulty certain precautions are to be observed. Firstly, the transistor should be fitted in a copper heat shunt to damp transient changes to avoid temperature gradients across the transistor case. Secondly, the two potentiometers 25, 26 should be located so that they are always at the same temperature. It is recommended that a dual-ganged concentric shaft unit is used with the outer tags soldered directly together. Thirdly, thin copper leads should be used to connect the transistor 11 and the two potentiometers 25, 26.

The modulator may be coupled to the following A.C. amplifier by a capacitor or a transformer. If capacitor coupling is used a good quality low leakage component is required otherwise a proportion of the first stage bias voltage will be chopped and appear as noise.

Transformer coupling has the advantage that is possible to have the chopper floating and the A.C. amplifier earthed thus giving low stray capacity to earth and better common mode rejection.

The chopper may be applied as a series or shunt switch. As a series switch $R_s$ is omitted.

The circuit is calibrated as follows. With the input leads short-circuited the potentiometer 26 is adjusted to give zero output. Then with the input leads open-circuited the potentiometer 25 is adjusted to remove transient spikes from the output waveform. During this adjustment the output leads should face an impedance greater than 5K ohm.

When a sine wave drive signal is used, harmonic components appear in the zero wave form as shown in FIGURE 6 and the secondary voltage should be up to about 9 volts peak to peak to maintain the mark to space ratio. If instead of square wave is employed, the driver transformer ratio may, for example, be chosen to give 6 volts peak to peak at the secondary. The primary can be arranged to operate at low voltage and high current (1 volt peak to peak or less).

FIGURE 7 shows a circuit developed to convert a sine wave to a square wave and which can be used to provide a square driving wave form for the modulator circuit. When the transistor 27 in this circuit is bottomed the output voltage is zero and when the transistor is open the output voltage rises to the stored level of the capacitor 28. The rise time for 50 c./s. is 200 $\mu$sec. and the mark to space ratio is about 1.07:1 although this may be controlled by a low impedance D.C. voltage in series with the sine wave supply. The output impedance is approximately 300 ohm.

We claim:

1. An electrical modulator circuit comprising a transistor having a D.C. input applied, and an A.C. output taken, directly across the emitter and collector thereof, and a driving square wave A.C. signal applied to the base thereof, and a source of the driving signal connected between said base and a junction between two resistive impedances connected respectively to said emitter and said collector, said resistance impedances being adjusted so that at zero D.C. input the ratio of the forward diode resistance of the emitter-base diode of said transistor to the resistance of said emitter-connected impedance is substantially equal to the ratio of the collector-base forward diode resistance of said transistor and the resistance of said collector-connected impedance.

2. A circuit as claimed in claim 1, wherein said transistor is a symmetrical transistor such that the ratio of the emitter and collector diode resistances thereof is substantially constant with temperature variation.

3. An electrical modulator circuit comprising a transistor, D.C. signal input terminals directly connected to the emitter and collector electrodes of said transistor, A.C. signal output terminals directly connected to said emitter and collector electrodes, a potentiometer having the resistance winding connected between said emitter and collector electrode, a diode connected between the base of said transistor and one side of a source of a driving A.C. signal; the other side of said source being connected to the slider of said potentiometer.

4. A modulator circuit as set forth in claim 3, wherein said source of a driving signal is a transformer secondary winding having one end of said secondary winding connected through two rectifying diodes in series to said base of said transistor, a junction point between said two diodes connected to the opposite end of said transformer secondary winding through a third diode, and said ends of said transformer winding also connected to one another through a resistor.

5. A modulator circuit as set forth in claim 4, wherein said transformer has a primary winding electrostatic screen, said screen and a transformer core being both connected to earth or reference potential.

6. A modulator circuit as set forth in claim 5, wherein said transformer secondary winding has an electrostatic screen with said screen connected to said transistor base.

7. A modulator circuit as set forth in claim 4, wherein said transformer has a secondary winding electrostatic screen, said screen being connected to the slider of a screen potentiometer said screen potentiometer having its resistance winding connected between said emitter and collector of said transistor.

8. A moduator circuit as set forth in claim 7, wherein said potentiometers are disposed together so as to be subject to the same physical environment in operation.

References Cited by the Examiner

UNITED STATES PATENTS

| | | | |
|---|---|---|---|
| 2,862,171 | 11/1958 | Freeborn | 332—31 |
| 2,926,296 | 2/1960 | Pinckaers | 321—45 |
| 3,011,117 | 11/1961 | Ford | 321—45 |
| 3,017,561 | 1/1962 | Williams | 321—45 |
| 3,021,431 | 2/1962 | Wellman | 321—45 |

LLOYD McCOLLUM, *Primary Examiner.*

SAMUEL BERNSTEIN, *Examiner.*